US009735783B2

(12) United States Patent
Lin et al.

(10) Patent No.: US 9,735,783 B2
(45) Date of Patent: Aug. 15, 2017

(54) FINE-GRAIN DYNAMICALLY RECONFIGURABLE FPGA ARCHITECTURE

(71) Applicants: Ting-Jung Lin, Taipei (TW); Wei Zhang, Hong Kong (CN); Niraj K. Jha, Princeton, NJ (US)

(72) Inventors: Ting-Jung Lin, Taipei (TW); Wei Zhang, Hong Kong (CN); Niraj K. Jha, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 14/766,617

(22) PCT Filed: Dec. 4, 2013

(86) PCT No.: PCT/US2013/073131
§ 371 (c)(1),
(2) Date: Aug. 7, 2015

(87) PCT Pub. No.: WO2014/123616
PCT Pub. Date: Aug. 14, 2014

(65) Prior Publication Data
US 2015/0381182 A1     Dec. 31, 2015

Related U.S. Application Data

(60) Provisional application No. 61/762,518, filed on Feb. 8, 2013.

(51) Int. Cl.
*H03K 19/177* (2006.01)
*H03K 19/00* (2006.01)

(52) U.S. Cl.
CPC ..... *H03K 19/1776* (2013.01); *H03K 19/0008* (2013.01); *H03K 19/17728* (2013.01); *H03K 19/17736* (2013.01); *H03K 19/17752* (2013.01)

(58) Field of Classification Search
CPC ......... H03K 19/0008; H03K 19/17728; H03K 19/17736; H03K 19/1776
See application file for complete search history.

(56) References Cited

U.S. PATENT DOCUMENTS 5,801,546 A      9/1998 Pierce et al.
5,883,525 A *    3/1999 Tavana ............. H03K 19/17704
                                                      326/39

(Continued)

FOREIGN PATENT DOCUMENTS

WO       2011066650         6/2011

OTHER PUBLICATIONS

Lin Ting-Jung et al. "FDR: A Fine-Grain Dynamicaly Reconfigurable Architecture Aimed at Reduing the FPGA-ASIC Gaps", Princeton University Department of Electrical Engineering (Dec. 2014)

(Continued)

*Primary Examiner* — Alexander H Taningco
*Assistant Examiner* — Kurtis R Bahr
(74) *Attorney, Agent, or Firm* — Meagher Emanuel Laks Goldberg & Liao, LLP

(57) ABSTRACT

A field programmable gate array (FPGA) and method of reconfiguring a FPGA are disclosed. The FPGA includes a plurality of logic elements interconnected with reconfigurable switches and at least horizontal and vertical direct links A memory is coupled to the reconfigurable switches, the memory being configured to store at least two run time configurations. The reconfigurable switches are reconfigurable based on a selected run time configuration stored in the memory. The memory may be a nanoelectronic random access memory (RAM). The memory may be configured to store the at least two run time configurations for at least four logic elements. Each logic element may include a look-up- (Continued)

table (LUT), a flip-flop, inputs and outputs. Each logic element may include dedicated carry logic. At least four logic elements may be interconnected with diagonal direct links.

16 Claims, 16 Drawing Sheets

(56) References Cited

U.S. PATENT DOCUMENTS

| | | | | |
|---|---|---|---|---|
| 5,894,565 | A * | 4/1999 | Furtek | H03K 19/1735 326/38 |
| 6,487,709 | B1 | 11/2002 | Keller et al. | |
| 7,759,968 | B1 * | 7/2010 | Hussein | H03K 19/17764 326/38 |
| 8,312,405 | B1 * | 11/2012 | Slonim | G06F 17/5072 716/116 |
| 2008/0074142 | A1 * | 3/2008 | Henderson | H03K 19/17732 326/41 |
| 2009/0219051 | A1 | 9/2009 | Zhang | |
| 2010/0271668 | A1 * | 10/2010 | Hasui | H04N 1/00954 358/474 |
| 2011/0238954 | A1 * | 9/2011 | Naito | G06F 15/7867 712/220 |
| 2012/0311316 | A1 * | 12/2012 | Salapura | G06F 11/348 713/100 |
| 2013/0135008 | A1 * | 5/2013 | Zhang | B82Y 10/00 326/41 |
| 2013/0147516 | A1 * | 6/2013 | Cho | H03K 19/1737 326/41 |
| 2014/0097869 | A1 * | 4/2014 | Ngai | H03K 19/017581 326/41 |

OTHER PUBLICATIONS

Lin, M. et al. "Performance Benefits of Monolithically Stacked 3D-FPGA" Stanford University Department of Electrical Engineering, (Feb. 2006).

Kuon, I. et al. "Measuring the Gap between FPGAs and ASICs", IEEE Transactions on Computer Aided Design, vol. 26, No. 2, (Feb. 2007).

Zhang, W. et al. "A Hybrid Nano/CMOS Dynamically Reconfigurable System-Part II: Design Optimization Flow", ACM Journal on Emerging Technologies in Computing Systems, vol. 5, No. 3, (Aug. 2009).

Zhang, W. et al. "A Hybrid Nano/CMOS Dynamically Reconfigurable System—Part I: Architecture", ACM Journal on Emerging Technologies in Computing Systems, vol. 5, No. 4, Art. 16, (Nov. 2009).

Noguchi, H. et al. "A 10T Non-Precharge Two-Port SRAM for 74% Power Reduction in Video Processing", IEEE Computer Society Annual Symposium, 0-7695-2896 (Jan. 2007).

Dehon, A. "Dynamically Programmable Gate Arrays: A Step Toward Increased Computational Density" Fourth Canadian Workshop of Field-Programmable Devices (May 1996).

Goldstein, S. et al. "PipeRench: A Reconfigurable Architecture and Compiler", Computer, vol. 33, pp. 70-77, (Apr. 2000).

Trimberger, S. et al. "A Time-Multiplexed FPGA", Procedures in IEEE Symposium—FPGAs for Custom Computing Machines, pp. 22-28, (Apr. 1997).

Khan, M.A., et al. "Improving Multi-Context Execution Speed on DRFPGAs," Proc. IEEE Asian Solid-State Circuits Conf, pp. 275-278, (Nov. 2006).

Fujii, T. et al. "A Dynamically Reconfigurable Logic Engine with a Multi-Context/Multi-Mode Unified-Cell Architecture," in Proc. IEEE Int. Solid-State Circuits Conf., pp. 364-365, Feb. 1999.

Hauck, S. et al "The Chimaera Reconfigurable Functional Unit," IEEE Trans. VLSI Syst., vol. 12, pp. 206-217, (Feb. 2004).

Zhang W. et al "Low-Power 3D Nano/CMOS Hybrid Dynamically Reonfigurable Architecture" ACM Journal on Emerging Technologies in Computing Systems, vol. 6, No. 3, Art. 10, pp. 10.1-10.32, (Aug. 2010).

Betz, V. et al "FPGA routing architecture: Segmentation and Buffering to Optimize Speed and Density," International Symposium on FPGAs pp. 59-68, (1999).

Betz, V et al. "VPR: A New Packing, Placement and Routing Tool for FPGA research," International Workshop on Field-Programmable Logic and Applications, pp. 213-222, (Sep. 1997).

Lisanke, R. "Logic synthesis and optimization benchmarks," Microelectronics Center of North Carolina, (Jan. 1991).

Lin, T. J. et al "SRAM•based Nature: A Dynamically Reconfigurable FPGA Based on 10T Low-Power SRAMs," IEEE Transactions on Very Large Scale Integration Systems, vol. 20, No. 11, pp. 2151-2156, (Nov. 2012).

Lingappan, L. et al. "Satisfiability•Based Test Generation for Nonseparable RTL Controller-Datapath Circuits" IEEE Transactions on Computer-Aided Design, vol. 25, pp. 544-557, (Mar. 2006).

Ghosh, I. et al "Hierarchical Test Generation and Design for Testability Methods for ASPPs and ASIPs," IEEE Transactions on Computer-Aided Design, vol. 18, No. 3, pp. 357-370, (Mar. 1999).

European Search Report for PCT/US2013/073131, Dated Mar. 25, 2014.

Supplementary European Search Report, dated Aug. 29, 2016.

* cited by examiner

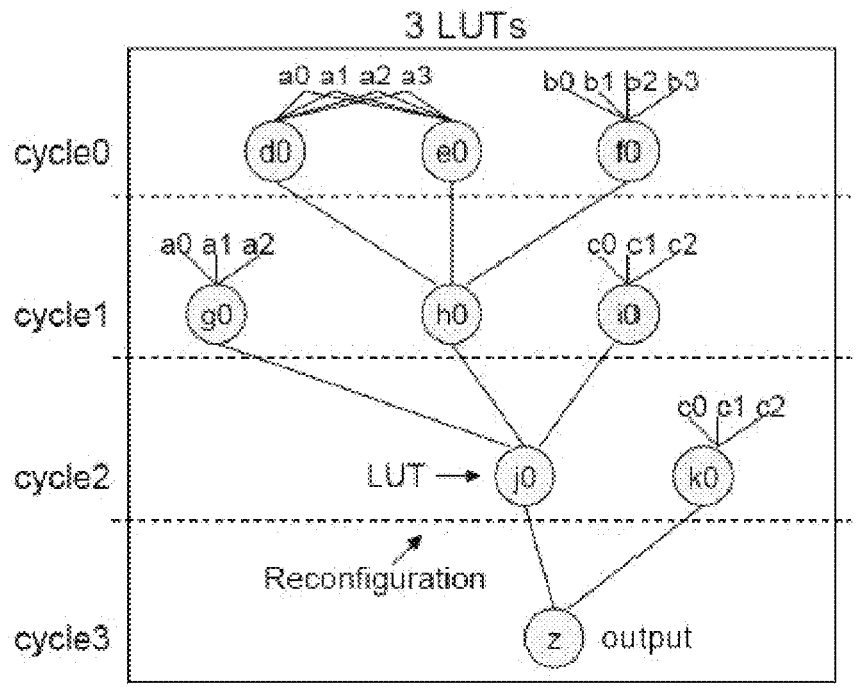
Figure 1a   Level-1 folding
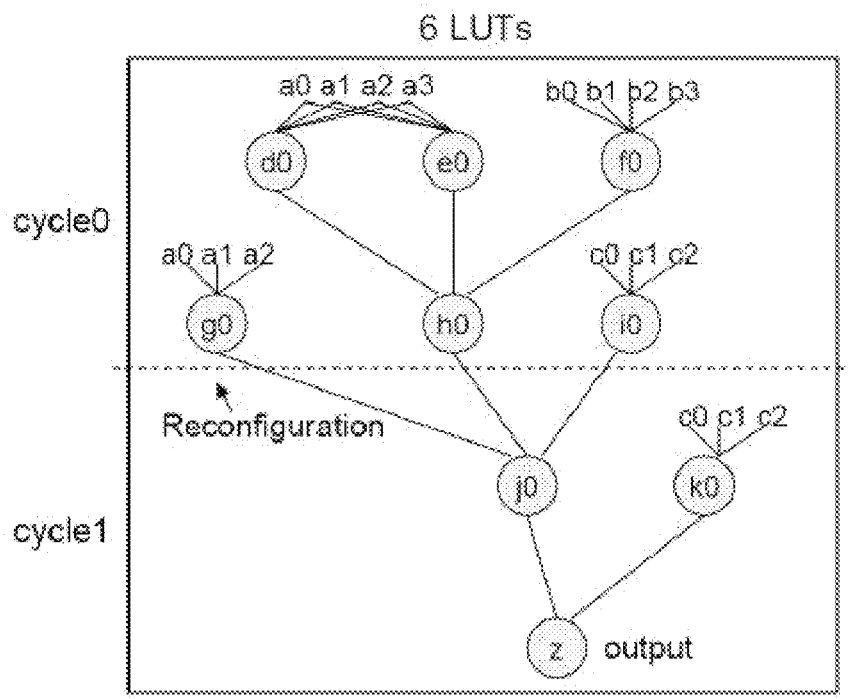
Figure 1b   Level-2 folding

TABLE I
DESIGN PARAMETERS FOR THE LE SHOWN IN FIG. 4

| Parameter | Description | Value |
|---|---|---|
| $l$ | #DFFs | 4 |
| $n$ | #inputs and #outputs | 16 |
| $F_{c\_LE}$ | #outputs each input connects to | 12 |
| $F_i$ | #inputs connected to the input MUXs | 16 |
| $F_o$ | #LE outputs the LUT and DFFs connect to | 16 |

| Benchmark | #LEs w/ carry | #LEs w/o carry | Reduction |
|---|---|---|---|
| ASPP4 | 112 | 82 | 26.8% |
| Biquad | 68 | 64 | 5.9% |
| ARF | 506 | 272 | 46.2% |
| DCT | 406 | 212 | 47.8% |
| EWF | 300 | 162 | 46.0% |
| FIR1 | 351 | 186 | 47.0% |
| FIR2 | 277 | 143 | 48.4% |
| HAL | 192 | 101 | 47.4% |
| Paulin | 74 | 64 | 13.5% |
| Wavelet | 333 | 211 | 36.6% |

Figure 10b

| Benchmark | Delay w/o diagonal links (ns) | Delay w/ diagonal links (ns) | Reduction |
|---|---|---|---|
| ASPP4 | 0.64 | 0.53 | 17.2% |
| Biquad | 0.60 | 0.47 | 21.7% |
| ARF | 0.86 | 0.64 | 25.6% |
| DCT | 0.99 | 0.65 | 34.3% |
| EWF | 0.80 | 0.62 | 22.5% |
| FIR1 | 0.75 | 0.58 | 22.7% |
| FIR2 | 0.73 | 0.58 | 20.5% |
| HAL | 0.65 | 0.53 | 18.5% |
| Paulin | 0.62 | 0.49 | 21.0% |
| Wavelet | 0.91 | 0.65 | 28.6% |

Figure 10c

| Benchmark | Memory size (kb) | #LUTs | #Memory blocks | #LEs |
|---|---|---|---|---|
| SmoothTriangle | 96 | 6696 | 24 | 600 |
| InterpolateAux | 64 | 4392 | 16 | 296 |
| HornerBezier | 12 | 1306 | 2 | 89 |
| MatrixMult | 96 | 6892 | 20 | 471 |
| MotionVector | 64 | 1548 | 8 | 128 |
| boundtop | 32 | 5837 | 4 | 600 |
| mkSMAdapter4B | 7 | 4188 | 10 | 567 |
| Jacobian | 256 | 4483 | 32 | 432 |
| YUV2RGB | 88 | 3210 | 12 | 312 |
| FIR | 32 | 3239 | 4 | 578 |

FINE-GRAIN DYNAMICALLY RECONFIGURABLE FPGA ARCHITECTURE

CROSS-REFERENCE TO PRIOR FILED APPLICATIONS

This application claims priority to U.S. provisional application No. 61/762,518 which was filed on Feb. 8, 2013 which is incorporated herein in its entirety.

GOVERNMENT RIGHTS IN THIS INVENTION

This invention was made with government support under Grant No. CNS-0719936 and Grant No. CCF-1216457 awarded by NSF. The government has certain rights in this invention.

TECHNICAL FIELD

This invention relates generally to a field-programmable gate array (FPGA) designs and more specifically, to a fine-grain dynamically reconfigurable FPGA.

BACKGROUND

With complementary metal-oxide-semiconductor (CMOS) technology being pushed to its physical limits, the design and manufacturing costs for application-specific integrated circuits (ASICs) are becoming prohibitive. Compared to ASICs, field-programmable gate arrays (FPGAs) provide a shorter time-to-market and lower design cost, which make FPGAs increasingly attractive. However, the price paid for the design flexibility is that current FPGAs do not achieve comparable area, power consumption or performance to ASICs. This is primarily due to the extensive overheads introduced to enable reconfigurability. It has been estimated that FPGAs result in 21× more silicon area, 3× larger delay, and 10× more dynamic power consumption compared to ASICs. Improved FPGA configurations that address these problems are desirable.

SUMMARY OF THE INVENTION

A field programmable gate array (FPGA) is disclosed. The FPGA includes a plurality of logic elements interconnected with reconfigurable switches and at least horizontal and vertical direct links. A memory is coupled to the reconfigurable switches, the memory being configured to store at least two run time configurations. The reconfigurable switches are reconfigurable based on a selected run time configuration stored in the memory. The memory may be a nanoelectronic random access memory (RAM). The memory may be a low-power non-precharge static random access memory (SRAM). The memory may be configured to store the at least two run time configurations for at least four logic elements.

Each logic element may include a look-up-table (LUT), a flip-flop, inputs and outputs. Each logic element may include dedicated carry logic. The dedicated carry logic may include a carry multiplexer coupled to the flip flop and an output multiplexer. At least four logic elements may be interconnected with diagonal direct links. The logic element may also include input and output multiplexers. The input multiplexer may have a plurality of inputs and the output multiplexer may have a plurality of outputs and the number of inputs may equal the number of outputs.

A method of reconfiguring a field programmable gate array (FPGA) is also disclosed. The method includes providing a plurality of logic elements interconnected with reconfigurable switches and at least horizontal and vertical direct links. The method also includes providing a memory coupled to the reconfigurable switches, the memory being configured to store at least two run time configurations. The reconfigurable switches are reconfigured based on a selected run time configuration stored in the memory.

BRIEF DESCRIPTION OF THE FIGURES

FIG. 1a is block diagram showing level-1 logic folding;
FIG. 1b is a block diagram showing level-2 logic folding;
FIG. 10b is a table that presents the number of LEs used in discrete cosine transform and wavelet transform computations;
FIG. 10c is a table that summerizes the mapping results with and without diagonal links.

DETAILED DESCRIPTION

Figure 2:
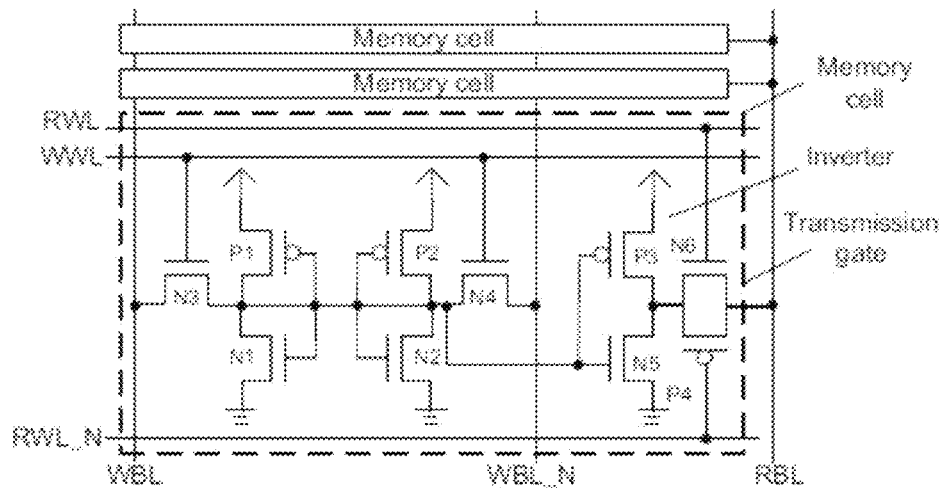
FIG. 2 is a block diagram of a 10 T SRAM cell.

Disclosed herein is a hybrid CMOS Nanotechnology reconfigurable architecture, called NATURE that address some of the problems in conventional FPGAs: logic density and efficiency of run-time reconfiguration. It exploits the concept of temporal logic folding, which partitions the circuit into a cascade of stages, and implements each stage using the same set of logic elements (LEs) through very fast dynamic reconfiguration. Since logic folding greatly localizes on-chip communications, with deep logic folding, e.g., when reconfiguration occurs after just one or two look-up table (LUT) levels in the circuit, the number of global interconnects can be drastically reduced because mostly local or short-distanced interconnects are needed. NATURE is not able to fully exploit this phenomenon because of its reliance on the traditional island-style architecture. To overcome this shortcoming, disclosed herein is a new Fine-grain Dynamically Reconfigurable (FDR) architecture that deviates from the type of island-style architecture used in NATURE and other traditional architectures.

FDR architecture includes an array of homogeneous reconfigurable LEs, which can be configured as logic or interconnect or a combination. This enables full flexibility in allocating hardware resources between logic and interconnect, as needed by the application. Most of the long-distance and global wires are eliminated. Due to enhanced use of temporal logic folding and a very significant reduction in the size of the interconnect hierarchy, logic density and interconnect power can be improved much further. Since FPGAs are most often used for data-dominated applications (e.g., video/image/graphics, etc.), which are often throughput-constrained, as long as the throughput constraint is met, the main gaps that remain to be bridged with ASICs are area and power.

Also disclosed herein is a new automatic flow for mapping circuits to FDR. An earlier developed a tool called NanoMap was used to support logic folding. See e.g., W. Zhang, L. Shang, and N. K. Jha, "A hybrid nano/CMOS dynamically reconfigurable system—part II: Design optimization flow," ACM J. Emerging Technologies in Computing Systems, vol. 5, pp. 13.1-13.31, August 2009, which is incorporated herein in its entirety. It automatically chooses the optimal logic folding level and targets different optimization objectives. However, FDR architecture is based on a network of LEs, which also incorporate routing switches. Therefore, the new mapping flow enables better utilization of routing resources. The flow incorporates several new interconnect optimization techniques, which exploit the routing resources provided within the LEs to reduce interconnect delay. It uses the logic folding feature from Nano-Map and decides whether to configure each LE for logic, interconnect or a combination.

Embedded memory blocks that store the configurations are distributed in the logic fabric. At the appropriate time, the reconfiguration bits are fed to the reconfigurable switches. NATURE uses CMOS logic and nanoelectronic random access memories (RAMs). Since the fabrication process of nanoelectronic RAMs is not mature yet, experimental results are presented assuming that the architecture is implemented in CMOS. For example, low-power non-precharge 10 T static RAMs (SRAMs) may be used, which save the precharge power normally consumed in bitlines during the read operation, for storage of configuration data. It should be understood that other implementations such as FinFET and others are possible without departing from the scope of this disclosure.

FDR was evaluated using a 65 nm CMOS technology. Compared to the conventional island-style architecture that does not employ logic folding, area is improved by 9.14×, which is half of the area gap between FPGAs and ASICs. The circuit delay and power consumption are reduced by 1.11× and 1.45×, respectively. Relative to NATURE under deep logic folding, area, circuit delay, and power consumption are improved by 2.12×, 3.28×, and 1.74×, respectively.

NATURE is basically a hybrid CMOS/nano-technology reconfigurable architecture that can facilitate run-time reconfiguration. It contains island-style logic blocks (LBs), connected by hierarchical reconfigurable interconnects. High-density, high-performance nanoelectronic RAMs are distributed in the logic fabric to store the reconfiguration bits. During reconfiguration, the bits are read from nanoelectronic RAMs and placed into the SRAM cells to reconfigure the logic and interconnects. The ability to reconfigure NATURE every few cycles leads to the concept of temporal logic folding.

Logic folding, which is akin to temporal pipelining, uses on-chip RAM-enabled run-time reconfiguration to realize different functions in the same LE every few cycles (even every cycle). This results in significant area and logic density improvements. Depending on how often reconfiguration is performed, logic folding can have different levels of granularity. This results in different area/delay characteristics, and offers significant flexibility in performing area-delay trade-offs. The number of LUT levels executed between two consecutive reconfigurations is referred to as the folding level.

FIGS. 1a and 1b show examples of level-1 and level-2 folding. In these examples reconfiguration is done after one LUT and two LUT levels, respectively. Increasing the folding level leads to a larger clock period, but smaller cycle count, since more computations are performed in one clock cycle. The circuit delay typically decreases as the folding level increases. See e.g., W. Zhang, N. K. Jha, and L. Shang, "A hybrid nano/CMOS dynamically reconfigurable system—part I: Architecture," ACM J. Emerging Technologies in Computing Systems, vol. 5, pp. 16.1-16.30, November 2009 which is incorporated herein in its entirety. However, increasing the folding level leads to a drastic increase in the number of LEs required. In this example, level-1 folding requires three LUTs and four cycles to execute. Each clock cycle is composed of reconfiguration delay, LUT computation delay, and interconnect delay. For level-2 folding, six LUTs and two cycles (whose clock periods are much larger) are needed. Compared to level-2 folding, level-1 folding uses fewer LUTs but leads to a slightly larger circuit delay due to the extra reconfigurations.

Nanoelectronic RAMs supporting 32 copies of configurations introduce around 20% area overhead and a reconfiguration delay that accounts for less than 10% of total circuit delay. This area overhead is easily recovered since NATURE only devotes about 60% of the chip area to interconnects (as opposed to 80% in traditional FPGAs) because it requires fewer global communications. Thus, the area saved in interconnects can be dedicated to the nanoelectronic RAMs without increasing overall chip area. This results in significant gains in area-delay product, logic density, and power consumption compared to traditional reconfigurable architectures.

A non-precharge low-power SRAM may be used. See e.g., H. Noguchi, Y. Iguchi, H. Fujiwara, Y. Morita, K. Nii, H. Kawaguchi, and M. Yoshimoto, "A 10 T non-precharge two-port SRAM for 74% power reduction in video processing," in Proc. IEEE Computer Society Annual Symp. on VLSI, pp. 107-112, March 2007 which is incorporated herein in its entirety. As the name implies, a 10 T SRAM cell has 10 transistors. As an alternative a 6 T SRAM cell may be used with a readout inverter, and a transmission gate for the read port, as shown in FIG. 2. It should be understood that other memory configurations may be used without departing from the scope of this disclosure. A write operation is performed as in a traditional 6 T SRAM through the application of logic 1 to the write wordline and the desired datum to the write bitline. To perform a read operation, since the readout inverter fully charges/discharges the read bitline, the precharge scheme is not required. Hence, the voltage on the bitline does not switch until the readout datum changes. In the case of random readout data, 39% power reduction is reported. For applications such as H.264 reconstructed-image memory, due to the spatial correlations in the data, 74% readout power reduction has been reported. Delay improves by 38% as well compared to the traditional SRAM, since the time for precharge is reduced. The cell area overhead relative to the 6 T SRAM cell is 20%. Since 10 T SRAM eliminates high switching activities on memory read bitlines, thus saving most of the precharge power, it is a promising wide on-chip memory for low-power applications.

Figure 3A:
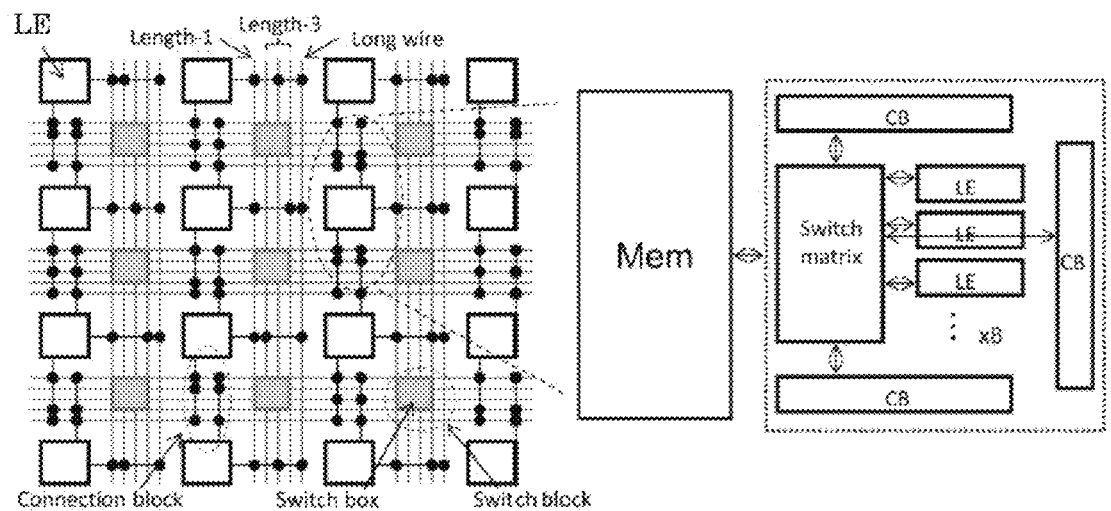
FIG. 3a is a block diagram of an FDR architecture.
Figure 3B:
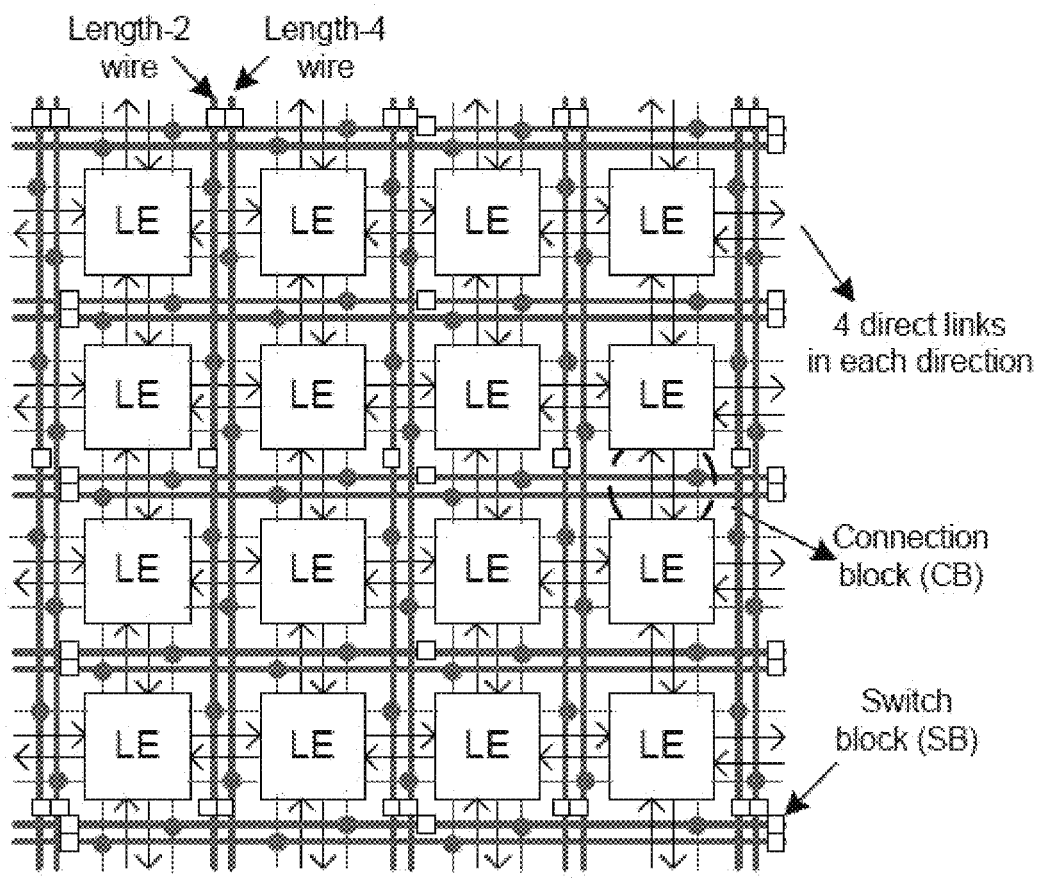
FIG. 3b is a block diagram of an FDR architecture with four length-2 and four length-4 tracks.

A high-level view of an FDR architecture is shown in FIG. 3a. The FDR architecture includes an array of homogeneous LEs. Neighboring LEs are connected with short interconnects (direct links). Each LE can be arbitrarily configured into a LUT or interconnect or a combination. Thus, when needed, LEs implement switches and thus form an interconnection network, supporting efficient short-distance communications. With logic folding, communications tend to become localized, which makes it possible to reduce the number of long interconnects. The architecture eliminates most of the long-distance and global wires. Although some LEs may need to be configured as interconnects, deep logic folding (e.g., level-1 folding) makes this interconnect overhead drastically smaller than the interconnect overhead in traditional FPGAs. A few routing tracks outside LEs support global signals, such as clock and reset, and those with high fanout. As in the conventional architectures, these routing tracks are connected by switch blocks (SBs). Connection blocks (CBs) provide the connections from LE I/Os to the routing tracks and direct links. FIG. 3b shows the usage of four length-2 and four length-4 tracks (SRAM block omitted for clarity). Fine-grain dynamic reconfiguration is enabled in such an architecture through distributed 10 T SRAM blocks.

Figures 4A, 4B:
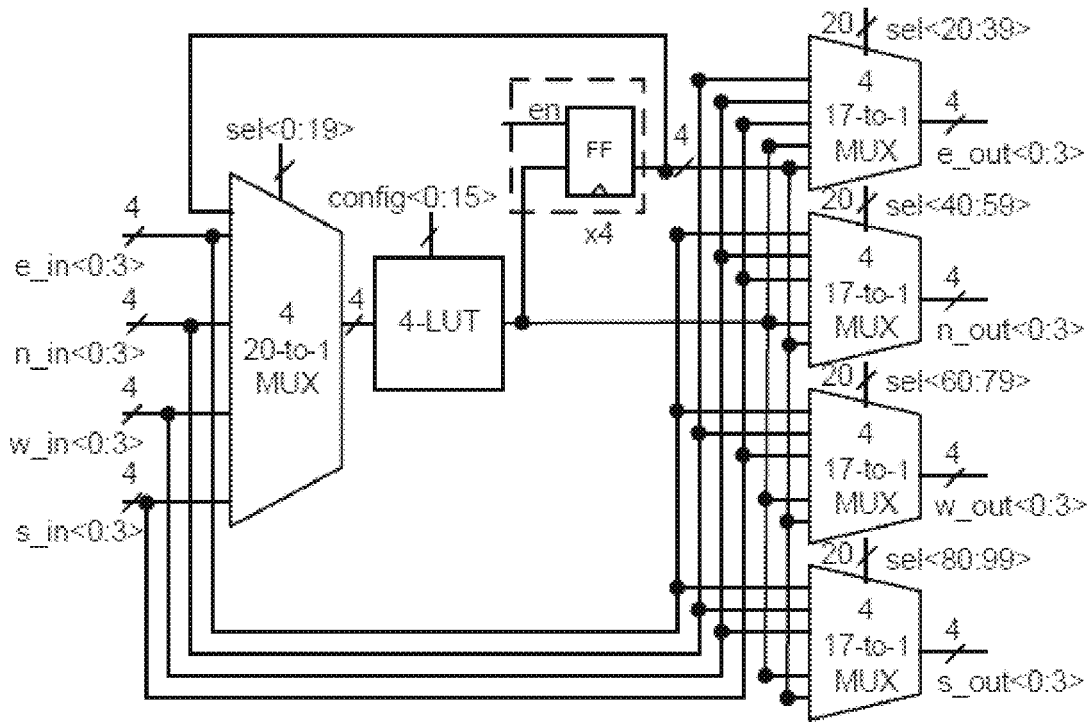
FIG. 4a is an example block diagram of an LE.
FIG. 4b is a table that summarizes the design parameters for an LE.

An LE is the basic unit of FDR. FIG. 4a shows a possible design of the LE, and FIG. 4b summarizes the design parameters, which will be explained in the following paragraphs. The LE contains a four-input LUT, 1 D flip-flops (DFFs), and n inputs and outputs (we illustrate an LE instance with l=4 and n=16 in the figure). The LE is designed to have an equal number of inputs and outputs, so that the pin connections between each pair of neighboring LEs are uniform. n/4 inputs and outputs are located on each side of the LE. Hence, there are n/4 direct links on each side for connections to neighboring LEs. Four multiplexers (MUXs) select inputs to the LUT. The output of the LUT is passed to neighboring LEs through the output MUXs, or stored in a local DFF. One configuration bit is associated with a DFF as the enable signal. To reduce the number of inter-LE interconnects, the DFFs are designed to latch only the output of the local LUT. The 16 output MUXs provide the flexibility to pass signals from the LUT, DFFs, or inputs, to the output pins. To just use the LE as an interconnect, output MUXs can simply transmit the bits from the inputs of the LE to its outputs.

Figure 5:
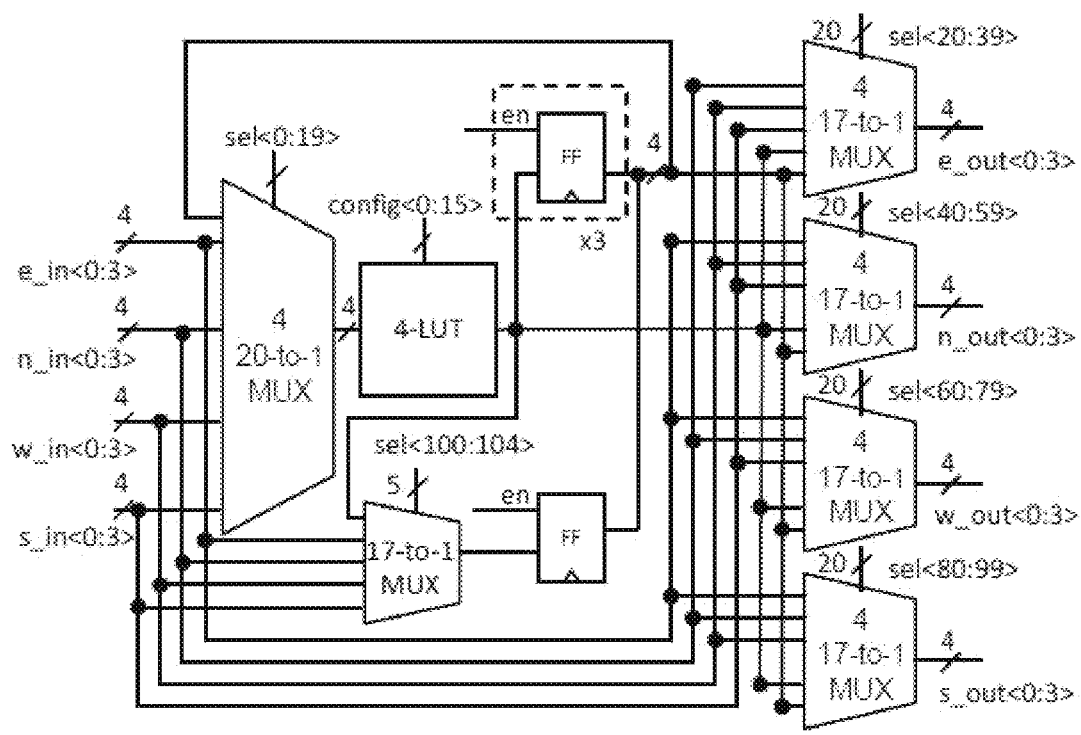
FIG. 5 shows another example LE design, which allows one DFF to latch an LE input bit.

Previous research works have tried to improve the clock period through pipelined interconnects. Most of the works explore the location and number of registers inserted into the interconnect. In FDR, the existing DFFs in the LEs can be used for the pipelining of interconnects. FIG. 5 shows another possible LE design, which allows one DFF to latch an LE input bit. The DFF can be used as a pipeline register along the routed paths.

$F_{s\_LE}$, $F_i$, and $F_o$ define the flexibility of input and output MUXs. $F_{s\_LE}$ refers to the number of outputs that each input can connect to. $F_i$ is the number of inputs allowed to connect to the input MUXs of the LUT. $F_o$ is the number of LE outputs the LUT and DFFs can connect to. FIG. 4a shows a design with full connectivity. $F_i$ and $F_o$ are both set to 16, which means each LE input connects to all the four input MUXs of the LUT, and each of the outputs from the LUT and DFFs is allowed to connect to all the LE outputs. $F_{s\_LE}$ is set to 12, so that for each LE output, there are connections from all of the LE inputs from the other three sides.

Figure 6:
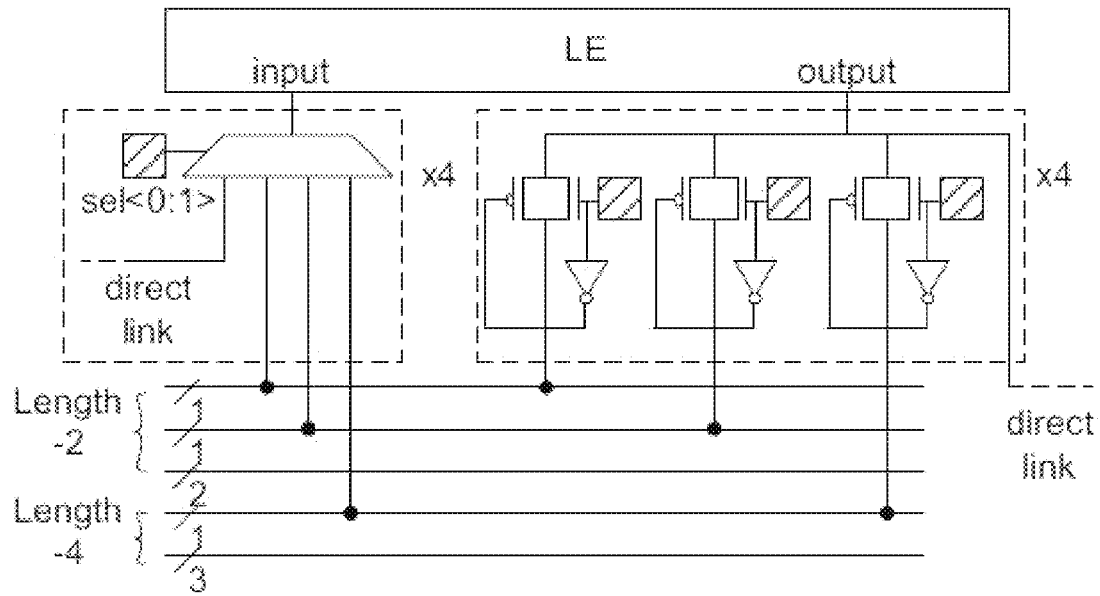
FIG. 6 is a block diagram of a connection block on one side of an LE.

Besides the short-distance and local communications supported by direct links, some signals with large fanouts may need to connect several LEs that span a large area. Routing these nets through many direct link segments is neither timing- nor area-efficient. Therefore, a few longer routing tracks are required. In FIG. 3b, there are four length-2 wires and four length-4 wires. A length-2 (4) wire spans two (four) LEs before it terminates at an SB. CBs connect the input/output pins of LEs to the routing tracks. An important parameter, $F_c$, is associated with a CB. It is the ratio of the number of tracks a pin of an LE connects to and the number of available tracks for each type of wire in the adjacent channel. We use $F_c=0.5$ for length-2 wires and $F_c=0.25$ for length-4 wires, so that each I/O pin of an LE connects to two length-2 wires and one length-4 wire. FIG. 6 shows the design of the CB on one side of the LE for the architecture and LE shown in FIGS. 3b and 4, respectively. For each LE input, a MUX selects the connection from two length-2 wires, one length-4 wire, and one direct link. For each output, three transmission gates connect to two length-2 wires and one length-4 wire, respectively. Each output also connects to the CB of a neighboring LE directly via a direct link. SBs connect the wire segments. The design parameter associated with an SB is $F_{s\_B}$, which is the number of output segments each input can connect to through the SB. SBs were designed with $F_{s\_B}=3$, which means that each segment entering the switch connects to three other segments.

Figure 7:
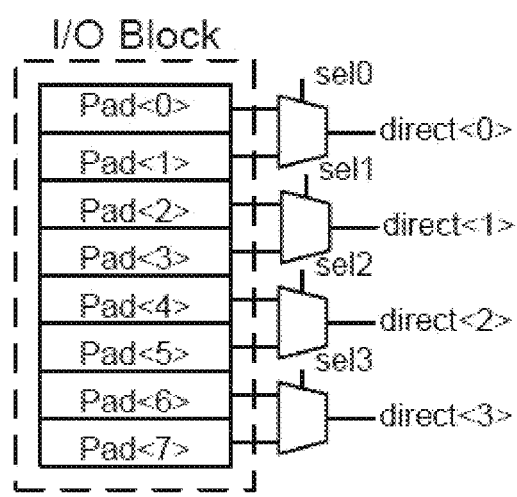
FIG. 7 is a block diagram of the connection between pads and direct links.

Fixing the number of direct links based on the number of LE inputs/outputs may limit the routability of nets connected to circuit inputs/outputs. An architectural parameter, called io_rat, may be specified as the number of pads per I/O block. When the number of direct links is less than io_rat, direct links are not enough to route circuit I/Os and, hence, extra routing wires are needed. These extra wires result in an area overhead from a larger CB and SB. From simulation results, it was observed that not all the I/O pads are active in every folding stage. Therefore, a new parameter, stage_io_rat, was intriduced to limit the maximum number of active I/O pads at each stage. This feature is implemented in hardware with MUXs that connect I/O blocks to direct links. FIG. 7 illustrates an example with io_rat=8 and stage_io_rat=4 (which is equal to the number of direct links). Thus, four out of the eight I/O pads can be used at each folding stage.

Figure 8:
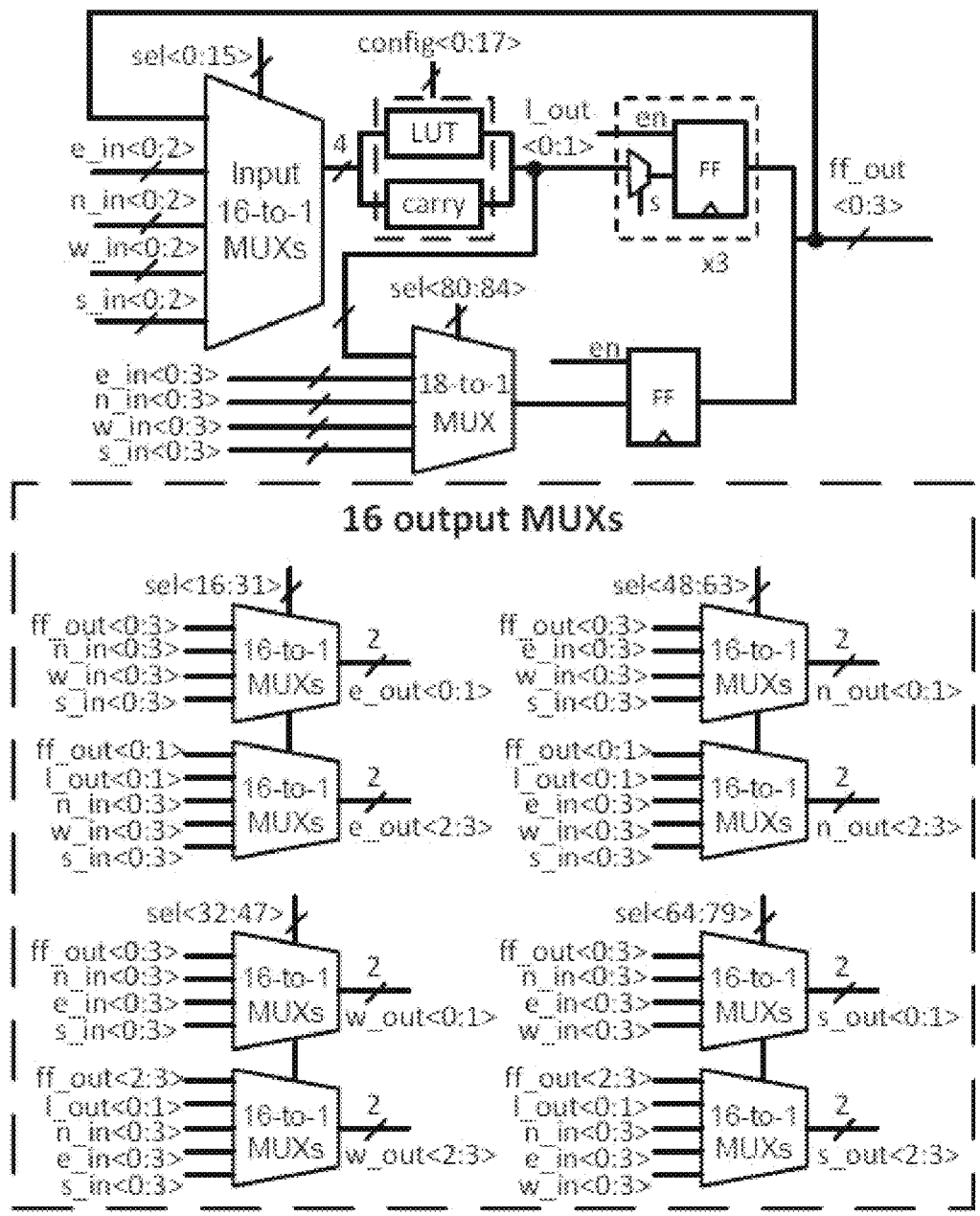
FIG. 8 is a block diagram of an LE design with dedicated carry logic.

FIG. 8 shows an LE design with dedicated carry logic. Different connections to the 16 output MUXs are shown in detail. We select the LE design parameter values as follows: $(l, n, F_{s\_LE}, F_o, F_i)=(4, 16, 12, 8, 12)$. The carry unit shares the same four inputs with the LUT. Two configuration bits are required to determine whether to perform the carry computation for an adder, subtractor or multiplier. The output of the carry unit has the same connectivity as the output of the LUT. It connects to the local DFFs and output MUXs. A MUX is added to select the bit between the LUT output and the carry output at the input of each DFF. Like the design shown in FIG. 5, a DFF is able to directly latch LE inputs to support interconnect pipelining. Each of the 16 LE output pins is driven by an output MUX. Since $F_{s\_LE}=12$, the inputs to an output MUX include 12 pins from the other three directions. $F_o=8$ implies that each of the outputs from the DFFs (ff_out<0:3>), LUT (l_out<0>), and carry unit (l_out<1>) needs to connect to eight output MUXs. The design also allows four more connections from the DFFs (ff_out<0:3>) to the output MUX. These connections are arranged such that each output MUX has 16 input pins.

Figure 9:
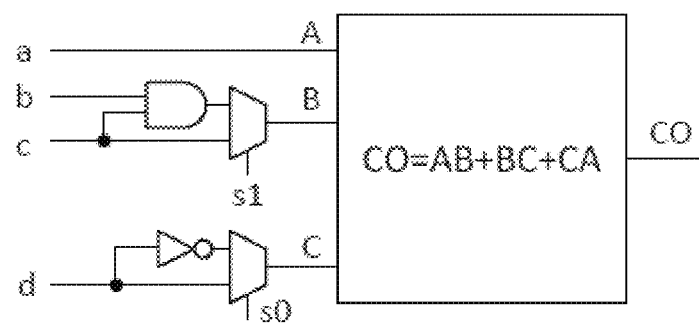
FIG. 9 is a block diagram showing a detailed design of carry logic.

FIG. 9 shows the detailed design of the carry logic. This example design is based on the carry logic of a full-adder that takes inputs A, B, and C, and computes carry-out CO. The four inputs to the carry unit, a, b, c, and d, are preprocessed depending on configuration bits, s0 and s1, to also support subtraction and multiplication. The three inputs, a, c, and d, connect directly to A, B, and C for additions. Input bits need to be inverted for subtractions. s0 determines whether to use the inverted version of d. An AND gate followed by an adder is widely used in many different implementations of multiplications. As the carry logic of the adder is already provided, we add an AND gate that computes bc. s1 selects the desired input for B between c and bc. With this design, the number of LEs used can be reduced by close to half for arithmetic computations.

Ten benchmarks specified at the RTL to architectures were mapped with and without carry logic. Among the 10 benchmarks, ASPP4 is an application-specific programmable processor. Biquad is a digital filter. Paulin is a differential-equation solver. ARF, EWF, FIR1, FIR2, and HAL are popular DSP applications acquired from MediaBench. DCT and Wavelet are mathematical functions that implement discrete cosine transform and wavelet transform computations, respectively. FIG. 10b presents the number of LEs used in both cases. The reduction in LE count ranges from 5.9% to 48.4%. ASPP4, Biquad, and Paulin are dominated by MUXs, which do not utilize carry logic. Hence, the impact of the dedicated carry logic is limited. Other benchmarks are dominated by arithmetic operations. Hence, the LE count can be reduced by almost half. When the area is reduced by half, the communication density within the array is doubled. Thus, we double the routing resources included in the original FDR to support the increased amount of communications. The new design includes 32 direct links and 16 routing tracks, in which eight are length-2 and eight are length-4 wires. The increased interconnect and carry logic together result in 30% area overhead per LE tile, which is more than recovered by the reduction in LE count for most of the benchmarks.

Figure 10A:
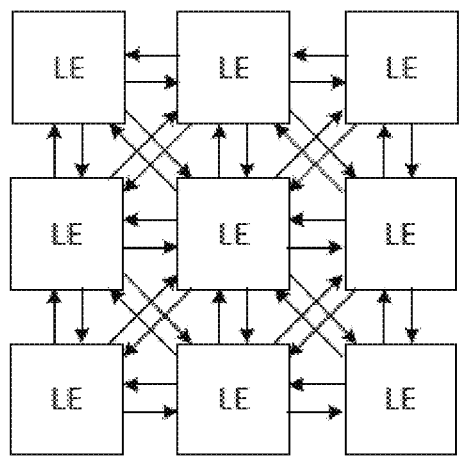
FIG. 10a is a block diagram showing an FDR architecture with the addition of diagonal direct links.

Deep logic folding drastically reduces the need for long interconnects. Short-distance interconnects are sufficient for most of the cases. Hence, several horizontal and vertical direct links are used to directly connect neighboring LEs to support efficient short-distance communications in the baseline FDR architecture shown in FIGS. 3a and 3b. In this example, diagonal connections are added to further improve routing flexibility, as shown in FIG. 10a (FDR 2.0 architecture). This new design does not require more direct links, but has the same number of links distributed to the eight directions evenly. As a routing net may need to make turns in the LE array, using a diagonal link allows the routing step to skip an LE and, hence, reduces routing delay. Since LEs are used as routing switches, reducing the number of LEs along a net also reduces the LE workload and alleviates routing congestion.

The above-mentioned ten benchmarks were mapped to the baseline FDR as well as FDR 2.0 architectures to compare interconnect performance. Both were assumed to have the same LE design, shown in FIG. 8. The baseline LE has 32 direct links, among which 16 are horizontal and 16 are vertical. The FDR 2.0 LE has the 32 direct links equally distributed to eight directions, as shown in FIG. 10a. The other routing resources are kept the same for the two architectures. Half of the routing tracks are length-2 and the others are length-4 wires. The two cases use the same placement. The architecture is implemented in 22 nm FinFET technology with shorted-gate (SG)-mode FinFETs. The optimization objective for FDRMap is set to minimization of circuit delay under an area constraint. FIG. 10c summarizes the mapping results. The critical path delay presented in this table includes both logic and interconnect delays. It determines the folding cycle time and total circuit delay. On an average, diagonal direct links reduce the critical path delay by 23.3%.

Besides configuration memory, we incorporate distributed SRAM blocks in FDR 2.0 for data storage. This improves its ability to implement both logic-intensive and memory-intensive applications. In this section, we present the detailed design of memory blocks. Design space explorations are performed with various benchmarks to obtain the desired memory density to achieve good performance.

Figure 11:
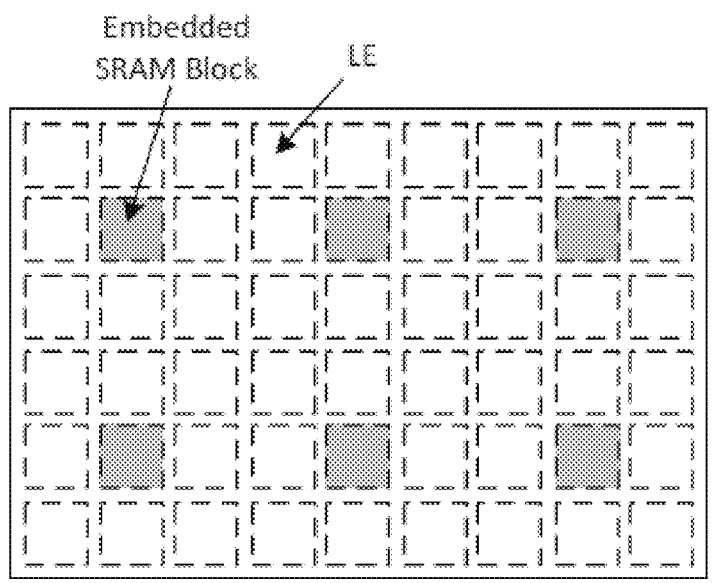
FIG. 11 is a block diagram of an architectural instance with one SRAM block per 3×3 array (i.e., with memory density equal to 1/9)

Current FPGAs tend to have embedded data memory arranged in a few columns. Such a design enables larger memory capacity and reduces the peripheral circuit overhead. However, it also results in longer memory access time and interconnect delay between logic and memory. Since logic folding already significantly improves area efficiency, we emphasize performance optimization in our memory design. We uniformly distribute the SRAM blocks in the LE array to improve communication efficiency. An architectural instance with one SRAM block per 3×3 array (i.e., with memory density equal to 1/9) is shown in FIG. 11.

Figure 12A:
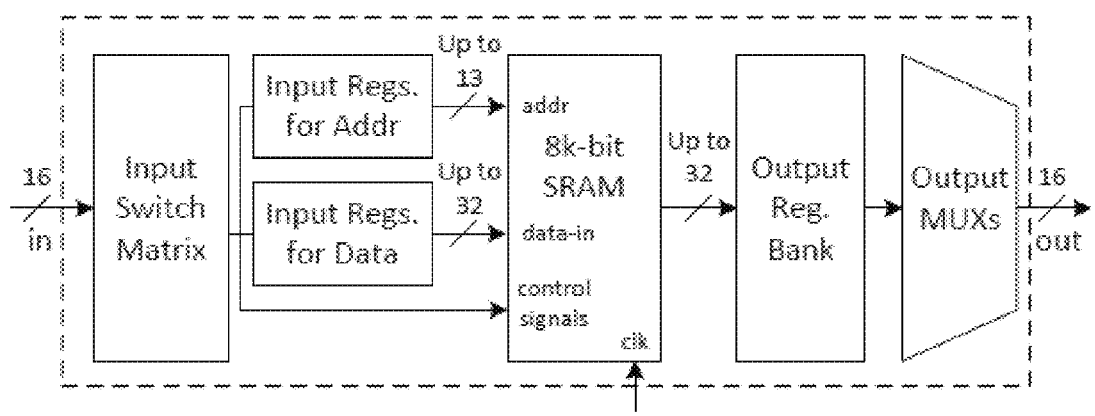
FIG. 12a is a block diagram showing the design of the memory block used in FDR 2.0.

FIG. 12a shows the design of the memory block used in FDR 2.0. It has 16 inputs and 16 outputs, same as in an LE. The data memory is designed to be 8k-bit so that it has the same area as an LE. The 16 I/Os connect to the general routing tracks and direct links in the same way as an LE does. The inputs to the single-port 8k-bit SRAM include one data port, address lines, clock, and control signals that include enable, clear, and reset. Since the embedded memory in an FPGA needs to be used in different applications, the design needs to be flexible. Thus, the 8k-bit SRAM can be configured in different ways: 8K×1, 4K×2, 2K×4, 1K×8, 512×16, and 256×32. The blocks can also be combined to form a larger memory.

In some memory configurations, the SRAM has more than 16 inputs or outputs. For example, a write operation to a 1K×8 memory requires 10 address bits and 8 data bits. In a folding cycle, a memory block can take at most 16 inputs, and/or transmit 16 outputs to the interconnection network. The memory block can acquire its inputs through multiple stages. The input bits are buffered at the input registers before the SRAM operation starts. The address register stores 13 bits and the data register 32 bits. The input switch matrix, composed of crossbars, connects the inputs to these registers. In different folding cycles, output MUXs selectively transmit the output bits to the logic computations performed in the LEs through the interconnection network.

Next, the mapping results for 10 different benchmarks that include memory accesses are presented. SmoothTriangle, InterpolateAux, HornerBezier, MatrixMult, and MotionVector are from MediaBench; boundtop and mkSMAdapter4B are from the VTR project; Jacobian implements the Jacobian transformation; FIR is a finite impulse response filter; YUV2RGB implements image conversion from the YUV mode to the RGB mode. Among these benchmarks, boundtop, mkSMAdapter4B, Jacobian, YUV2RGB, and FIR are specified at the gate level, and the others at the RTL.

Figures 12B, 13:
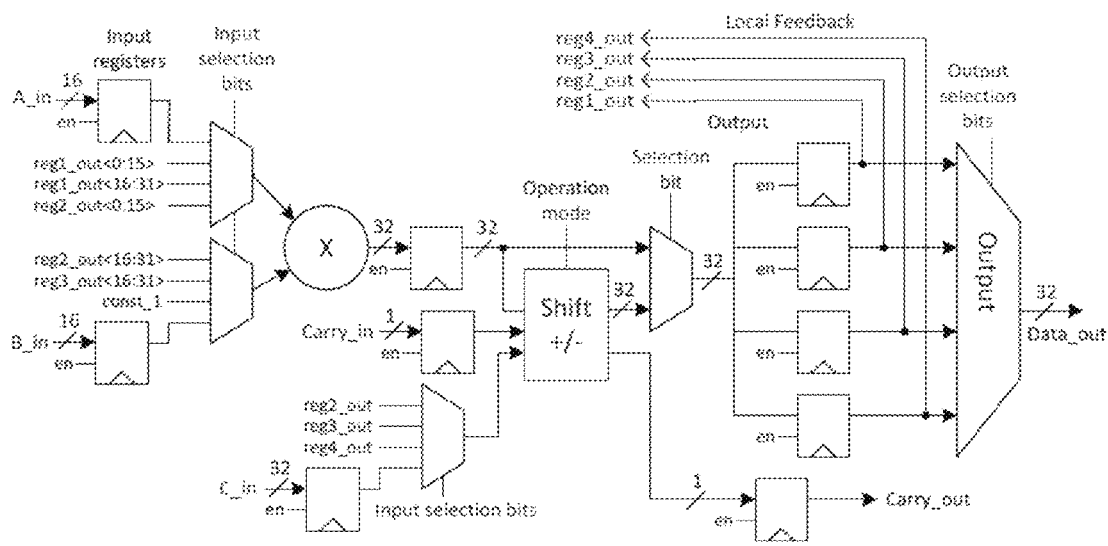
FIG. 12b is a table that lists the hardware resource requirement for each benchmark after logic folding is performed.
FIG. 13 is a block diagram of a DSP block used in FDR 2.0.

FIG. 12b lists the hardware resource requirement for each benchmark after logic folding is performed. We assume read or write of the 8k -bit SRAM can be accomplished in one folding cycle. Hence, access to the memory block requires at least two cycles where extra clock cycles are needed to acquire all the input bits. The benchmarks are mapped to the FDR 2.0 architecture with distributed data memory blocks, as shown in FIG. 11. The density of the distributed memory blocks determines both area efficiency and performance. More memory blocks are required to provide a larger capacity if a benchmark is more memory-intensive. On the other hand, a lower memory density is preferable to leave space for LEs for a benchmark dominated by logic.

FPGAs are widely used in multimedia processing, as they provide better performance compared to software processors, and better design flexibility compared to ASICs. Embedded multipliers or more complicated DSP blocks are often incorporated into FPGAs to facilitate applications that include a large number of arithmetic operations. These blocks are optimized specifically for arithmetic operations and usually result in better area and performance for digital signal processing applications. Our previous work has shown that FDR with only fine-grain LEs achieves 9.14× and 1.11× improvement, respectively, in area and delay compared to conventional FPGAs.

FIG. 13 shows the design of the DSP block used in FDR 2.0. It has a 16-bit Wallace tree multiplier, and a 32-bit carry-lookahead adder/subtractor that can be configured to perform addition or subtraction. The combination of the multiplier and adder enables fast multiply-accumulate (MAC) operation, which takes the product of two numbers and adds it to an accumulator. Controlled by the "Operation mode" variable, the inputs to the adder/subtractor can be shifted by 16 bits in order to realize a wider multiplier.

As discussed in above, more output registers are required to store temporary results when logic folding is performed. Hence in this example, four 32-bit output registers are used, similar to the LE design. Logic folding enables sharing of the DSP block, so that it can perform different operations in different folding stages. There are feedback paths from the output registers to the inputs of the multiplier and the adder/subtractor. They enable efficient local communication when the DSP block is reused. The paths to the adder/subtractor enable the implementation of an accumulator. The connections from the four 32-bit registers to the input MUXs are arranged in such a manner that the input pins of the MUXs are fully utilized. The 4-input MUXs provide flexible feedback connections without incurring a large area overhead. Since the multiplier requires only 16-bit inputs, the 32-bit feedback signals to it are divided into the upper 16 bits and lower 16 bits, which can be used to implement multiplications of larger bit-width.

The DSP block takes 65 input pins from the interconnection network, including 16-bit A_in and B_in, 32-bit C_in, and 1-bit Carry_in. The MUXs at the inputs of multiplier and adder/subtractor select their inputs from the DSP input pins and feedback signals. Multiplication with constant 1 makes it possible to bypass the multiplier, and implement just addition or subtraction. The output MUXs select from the outputs stored in the four 32-bit output registers, and transmit these 32 bits and a single-bit Carry_out to the interconnection network at any given time.

Figure 14:
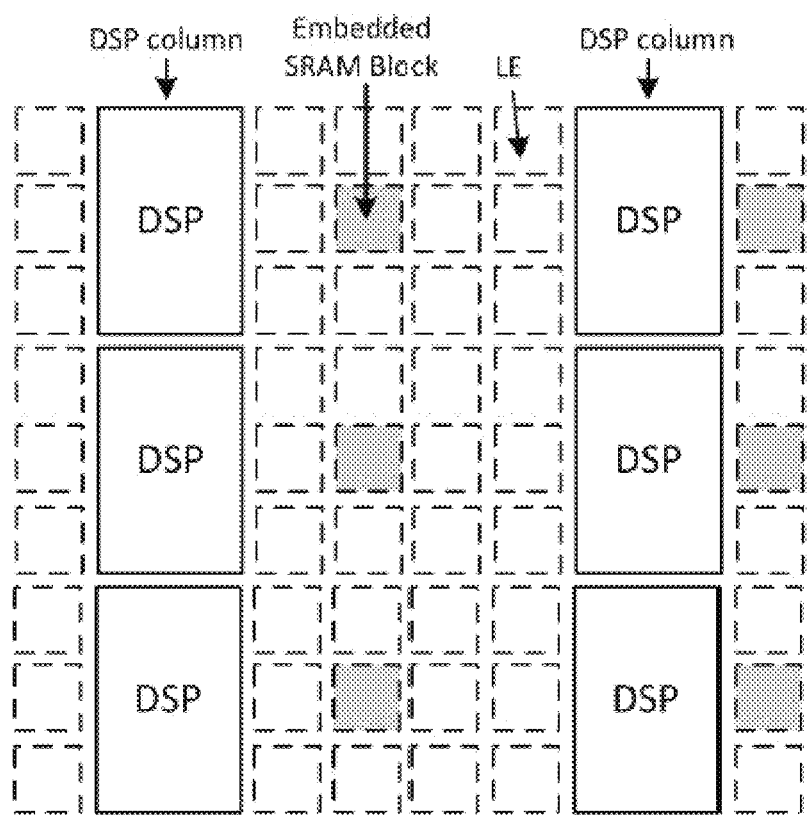
FIG. 14 is a block diagram showing DSP blocks incorporated into dedicated columns.
Figure 15:
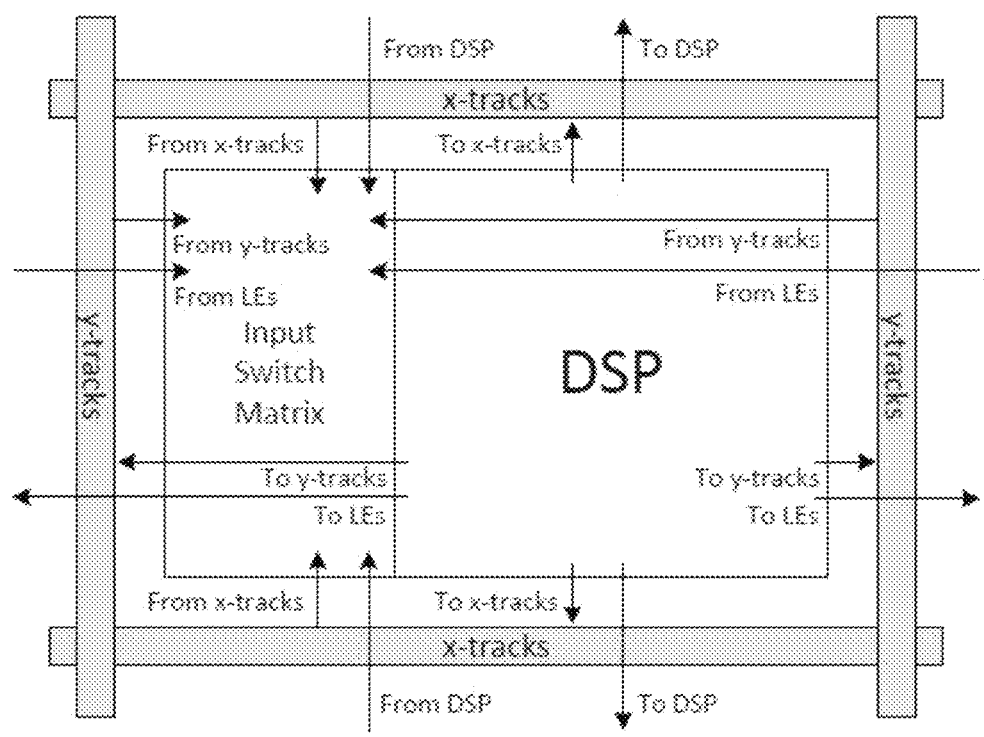
FIG. 15 is a a block diagram showing the input and output connections of a DSP block.

By taking into consideration its interface to surrounding interconnect, the size of a DSP block is designed to fit into a rectangular 2×3 array of LE tiles. The DSP blocks are incorporated into dedicated columns, as shown in FIG. 14. The Carry_in and Carry_out pins are located at the top and bottom of the DSPs. The other 64 inputs and 32 outputs are equally distributed on the left and right sides of the block. The DSP blocks in the same column can form a wider adder/subtractor with dedicated connections for carry logic when required. To support efficient communications between DSPs, 64 vertical direct links are incorporated on their top and bottom sides to transmit the output bits to neighboring DSPs. Other than these direct links, no other specific interconnect resources are dedicated to DSPs. The DSP blocks are connected to the LE array by the general interconnection network that includes routing tracks and direct links from neighboring LEs. An input switch matrix is attached to each DSP. It contains several MUXs that select A_in, B_in, and C_in, from the direct links and routing tracks. The input and output connections of a DSP block are shown in FIG. 15.

Figure 16:
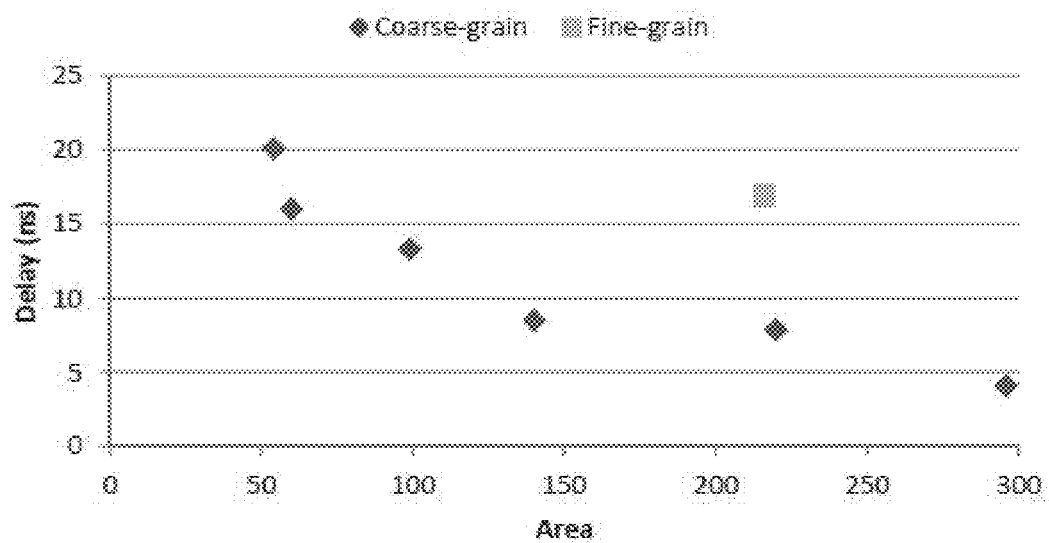
FIG. 16 is a graph showing delay-versus-area for DCT.

As mentioned earlier, coarse-grain architecture does not always lead to better area compared to the fine-grain architecture. However, circuit delay can be improved by 3.6×, on an average, when there is no area constraint. Most benchmarks show a decreasing trend in area as the delay constraint is gradually relaxed. For benchmarks dominated by DSP operations, such as ARF, DCT, EWF, FIR1, FIR2, Wavelet, SmoothTriangle, HornerBezier, MatrixMult, and MotionVector, a rapid area decrease is observed as the delay overhead increases. This trend can be observed more clearly in FIG. 16, which shows the delay-versus-area graph for DCT. In the extreme case, FDRMap tries to minimize delay by scheduling all the DSP operations as soon as possible. Thus, many operations are squeezed into the first few folding cycles. However, if the delay constraint is relaxed, such as by adding three more clock cycles (since a DSP block takes three clock cycles), then the DSP blocks can be reused, thus reducing the number of DSP blocks significantly. As the tool continues to add more folding cycles, the limited number of DFFs within the DSP blocks becomes the bottleneck, and the decreasing trend in area becomes slower.

Figure 17:
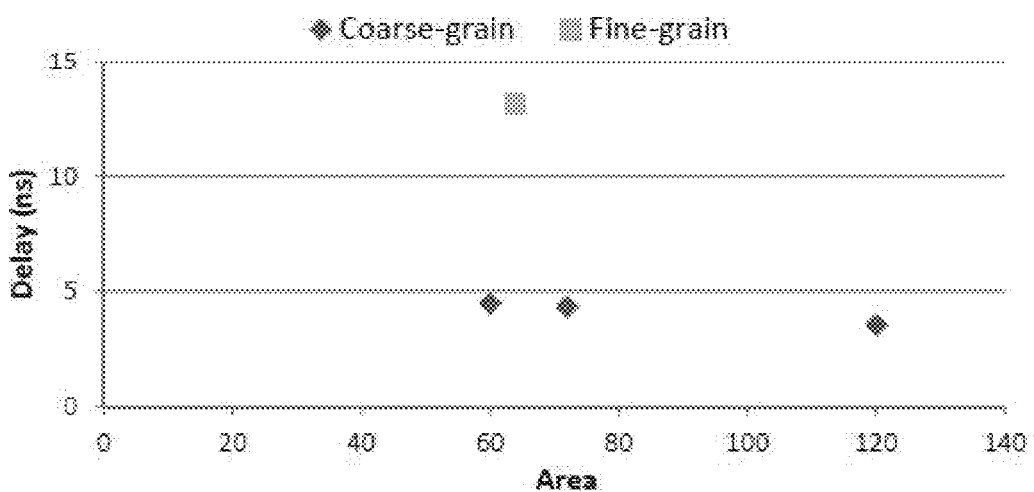
FIG. 17 is a graph showing delay-versus-area for Biquad.

FIG. 17 shows the delay-versus-area graph for Biquad, which shows another trend (also seen in the case of ASPP4 and Paulin). These benchmarks are dominated by the logic executed in LEs. Thus, adding more folding cycles has a limited impact on the number of DSPs. Although the number of LEs can also be reduced, the impact on the total area is less compared to the benchmarks discussed above. The mapping results of HAL and InterpolateAux also do not show area-delay tradeoffs in coarse-grain mapping. This is because HAL's logic circuit has many LUT levels, which require more folding cycles than DSP blocks. The circuit structure of InterpolateAux already enables DSP operations to be performed in different cycles even with as-soon-as-possible scheduling. Hence, the reuse of DSP blocks is possible.

Figure 19:
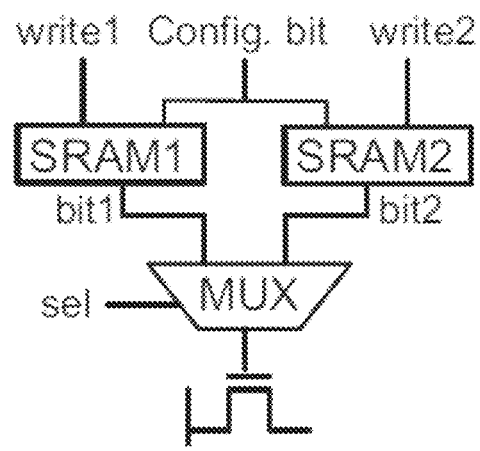
FIG. 19 is a block diagram showing two single bit SRAM cells coupled to a 2-to-1 MUX.

FIG. 19 shows a configuration for controlling a reconfigurable switch. It includes two 6T SRAM cells and a 2-to-1 MUX. The write1 and write2 signals decide when SRAM1 and SRAM2 are configured, respectively. The sel signal selects the cell that is to be used to control the switch in the current cycle. When one SRAM cell is used, the other can be reconfigured for the computation to be performed in the upcoming cycle, or remain in a wait state when the first cell needs to be used in the next cycle as well. In the next cycle, the two SRAM cells switch their roles. Hence, if the memory access time is smaller than the computation delays, the configuration delays can be totally hidden.

Figure 18:
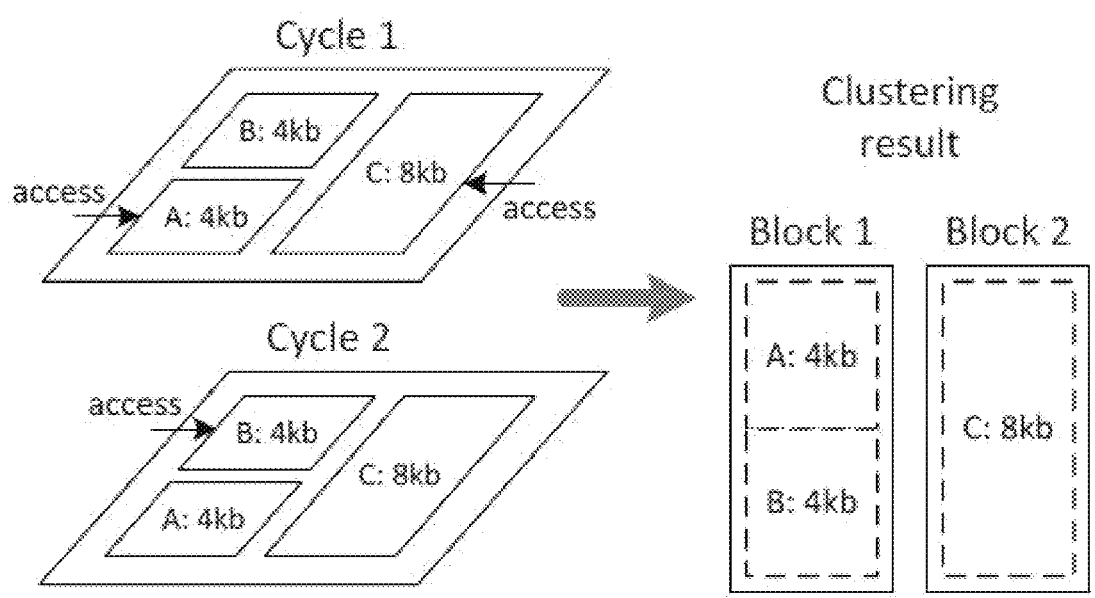
FIG. 18 is block diagram showing an example in which memory A and B share the same memory block as they are accessed in different clock cycles.

Next, we look at the sharing of memory blocks. We do not allow a memory block to be reconfigured with different content in different clock cycles. However, a memory block can be split and shared by multiple smaller memories if the memory operations are not in the same folding cycle. FIG. 18 shows an example in which memory A and B share the same memory block as they are accessed in different clock cycles.

Routability-driven placement: The original VPR-based placement and routing supported only fine-grain LEs. We modify the tool to include both data memory blocks and DSP blocks. For efficient design space exploration, we allow the users to specify the memory density, DSP dimensions, and DSP density. The locations of the memories and DSP blocks are fixed based on the specifications.

Routing: VPR is modified to address diagonal direct links and the vertical direct links between DSP blocks. The modified tool routes communications among LEs, memory blocks, and DSP blocks.

The references listed herein are also part of the application and are incorporated by reference in their entirety as if fully set forth herein. It should be understood that many variations are possible based on the disclosure herein. Although features and elements are described above in particular combinations, each feature or element can be used alone without the other features and elements or in various combinations with or without other features and elements. The methods or flow charts provided herein may be implemented in a computer program, software, or firmware incorporated in a non-transitory computer-readable storage medium for execution by a general-purpose computer or a processor. Examples of computer-readable storage mediums include a read-only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs)

What is claimed is:

1. A field programmable gate array (FPGA) comprising:
a plurality of logic elements interconnected with reconfigurable switches and at least horizontal and vertical direct links;
an embedded memory and a pair of single bit static random access memory (SRAM) cells coupled to each reconfigurable switch, a first SRAM cell being configured to receive and store a first run time configuration from the embedded memory for use in a first clock cycle and a second SRAM cell being configured to receive and store a second run time configuration from the embedded memory during the first clock cycle for use during a second adjacent clock cycle;
the reconfigurable switches being reconfigurable during ft the first clock cycle based on the first run time configuration stored in the first SRAM cell, the reconfigurable switches being reconfigurable during the second adjacent clock cycle based on the second run time configuration stored in the second SRAM cell.

2. The FPGA of claim 1 wherein the memory is configured to store the at least two run time configurations for at least four logic elements.

3. The FPGA of claim 1 wherein each logic element comprises a look-up-table (LUT), flip-flop, inputs and outputs.

4. The FPGA of claim 3 wherein each logic element comprises dedicated carry logic.

5. The FPGA of claim 4 wherein the dedicated carry logic comprises a carry multiplexer coupled to the flip flop and an output multiplexer.

6. The FPGA of claim 3 wherein the logic element further comprises input and output multiplexers.

7. The FPGA of claim 6 wherein the input multiplexer has a plurality of inputs the output multiplexer has a plurality of outputs and the number of inputs equals the number of inputs.

8. The FPGA of claim 1 wherein at least four logic elements are interconnected with diagonal direct links.

9. A method of reconfiguring a field programmable gate array (FPGA), the method comprising:
providing a plurality of logic elements interconnected with reconfigurable switches and at least horizontal and vertical direct links;
providing an embedded memory and a pair of single bit static random access memory (SRAM) cells coupled to each reconfigurable switch, a first SRAM cell being configured to receive and store a first run time configuration from the embedded memory for use in a first clock cycle and a second SRAM cell being configured to receive and store a second run time configuration from the embedded memory during the first clock cycle for use during a second adjacent clock cycle;
reconfiguring the reconfigurable switches during the first clock cycle based on the first run time configuration stored in the first SRAM cell, the reconfiguring the reconfigurable switches during the second adjacent clock cycle based on the second run time configuration stored in the second SRAM cell.

10. The method of claim 9 wherein the memory is configured to store the at least two run time configurations for at least four logic elements.

11. The method of claim 9 wherein each logic element comprises a look-up-table (LUT), flip-flop, inputs and outputs.

12. The method of claim 11 wherein each logic element comprises dedicated carry logic.

13. The method of claim 12 wherein the dedicated carry logic comprises a carry multiplexer coupled to the flip flop and an output multiplexer.

14. The method of claim 11 wherein the logic element further comprises input and output multiplexers.

15. The method of claim 14 wherein the input multiplexer has a plurality of inputs the output multiplexer has a plurality of outputs and the number of inputs equals the number of inputs.

16. The method of claim 9 wherein at least four logic elements are interconnected with diagonal direct links.

* * * * *

UNITED STATES PATENT AND TRADEMARK OFFICE
CERTIFICATE OF CORRECTION

PATENT NO. : 9,735,783 B2  
APPLICATION NO. : 14/766617  
DATED : August 15, 2017  
INVENTOR(S) : Ting-Jung Lin, Wei Zhang and Niraj K. Jha Page 1 of 1

It is certified that error appears in the above-identified patent and that said Letters Patent is hereby corrected as shown below:

In the Claims

In Column 11 In Claim 1, Line 58 should read:
the reconfigurable switches being reconfigurable during Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*